(12) United States Patent
Tinsley et al.

(10) Patent No.: US 6,915,459 B2
(45) Date of Patent: Jul. 5, 2005

(54) ACTIVE FAILSAFE DETECTION FOR DIFFERENTIAL RECEIVER CIRCUITS

(75) Inventors: Steven J. Tinsley, Garland, TX (US); Julie Hwang, Richardson, TX (US); Mark W. Morgan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 405 days.

(21) Appl. No.: 09/818,115

(22) Filed: Mar. 27, 2001

(65) Prior Publication Data

US 2002/0144188 A1 Oct. 3, 2002

(51) Int. Cl.[7] .............................................. G06F 11/24
(52) U.S. Cl. ............................. 714/43; 714/47; 714/56; 714/721
(58) Field of Search ............................. 714/40, 43, 47, 714/56, 721

(56) References Cited

U.S. PATENT DOCUMENTS 5,488,306 A * 1/1996 Bonaccio .................... 324/539
5,867,775 A * 2/1999 Shirai et al. .............. 455/115.1
6,111,437 A * 8/2000 Patel ............................ 327/74
6,147,515 A * 11/2000 Ang et al. ..................... 327/57
6,493,401 B1 * 12/2002 Erckert ......................... 714/43

* cited by examiner

Primary Examiner—Robert Beausoliel
Assistant Examiner—Joseph D Manoskey
(74) Attorney, Agent, or Firm—William B. Kempler; W. James Brady, III; Frederick J. Telecky, Jr.

(57) ABSTRACT

The present invention provides a method, system and apparatus for providing failsafe detection for a differential receiver. A bus activity signal (11) is activated when receiving a differential data signal of sufficient amplitude to transition through a predetermined threshold. A failsafe signal (620) indicates a low differential voltage condition. A countdown time period commences (85) upon activation of either signal, and a failsafe condition is determined (89) to exist if the failsafe signal is active (87) when the countdown time period expires (86).

20 Claims, 3 Drawing Sheets

ACTIVE FAILSAFE DETECTION FOR DIFFERENTIAL RECEIVER CIRCUITS

BACKGROUND OF THE INVENTION

1. Technical Field of the Invention

The present invention relates generally to the field of integrated circuits and, more particularly, to a method, system and apparatus of failsafe detection for differential receiver circuits.

2. Background of the Invention

For data transmission it is important to have bus drivers and bus receivers that allow devices to communicate quickly, efficiently, and accurately. This data transmission may occur within a computer system, for example. One common technique for implementation of data transmission within a computer bus uses differential signaling technology to communicate between devices in a computer system. A variety of differential signaling standards exist, such as low voltage differential signaling (LVDS), high voltage differential signaling (HVDS) and others. Of course, such differential signaling may also be used for other long distance data transmission.

Typically, a LVDS driver includes a current source that drives the differential pair lines in opposition to each other. The differential receiver has a high DC impedance, so that the majority of driver current flows across a termination resistor generating a voltage drop across the receiver input. When the driver switches, it changes the direction of current flow across the resistor, thereby creating a valid "1" or "0" logic state. To help ensure reliability, differential receivers may have a failsafe feature that helps to insure the output to be in a known logic state under certain fault conditions. These fault conditions can include open, shorted, or terminated receiver input.

In interface circuits, and receiver circuits in general, it is advantageous to be able to detect failure conditions on the bus and react appropriately. Open circuit faults in general can cause problems in interface systems, sending receivers into unknown or oscillating states and generally causing havoc in digital systems. Failsafe circuits seek to detect such fault conditions and reactively apply a known state to the receiver outputs. It is also desirable that such failsafe detection circuits be capable of signaling or setting a fault bit so that digital circuits may deal with the fault conditions in a manner appropriate for the specific application.

Although current failsafe circuits are capable of accurately detecting/signaling on occurrence of the aforementioned fault conditions, they also signal false alarms in certain signal noise related events leading to uncertainty in the state of the receiver output.

SUMMARY OF THE INVENTION

The present invention achieves technical advantages as a method, system and apparatus for providing failsafe detection for a differential receiver. A bus activity signal is activated when receiving a differential data signal of sufficient amplitude to transition through a predetermined threshold. A failsafe signal is activated when a low differential voltage condition is detected. A countdown time period commences upon activation of either signal, and a failsafe condition is determined to exist if the failsafe signal is active when the countdown time period expires.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1:
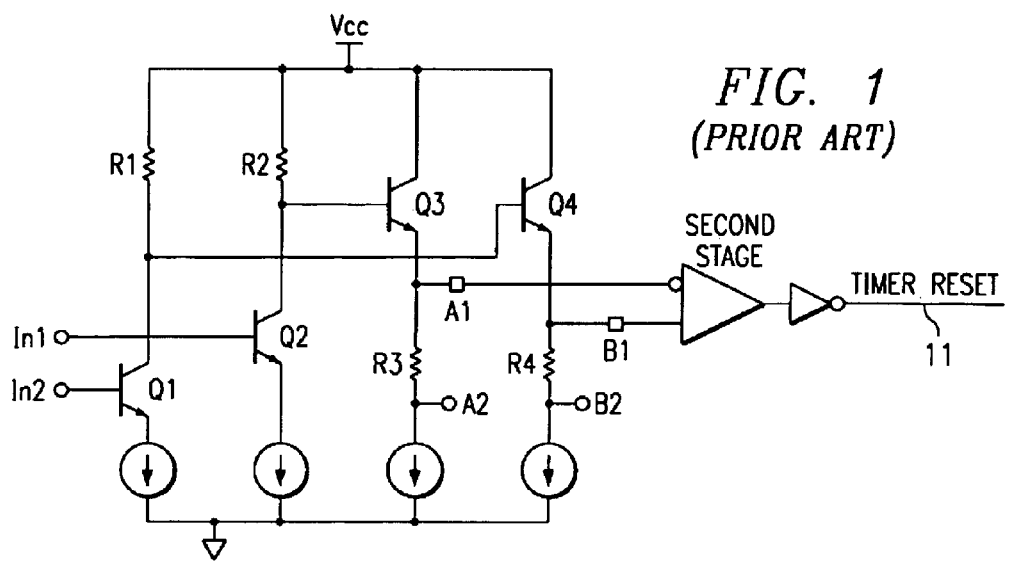
FIG. 1 illustrates a differential input stage circuit.

Typical receiver architectures use one or more stages of low-gain/high-speed NPN input differential amplifiers to amplify an input signal, then a differential to single-ended converter stage to achieve rail-to-rail levels. FIG. 1 illustrates the basic differential input stage architecture.

Referring to FIG. 1, the differential pair Q1 and Q2 provide gain to the input signal at In1/In2. The emitters of Q1 and Q2 are respectively coupled to Vcc via resistors R1 and R2. Q3 and Q4 are connected as emitter followers, and act as level shifters to the input of the second stage. The level-shifted signal is taken from points A1/B1 to the input of the second stage. Resistors R3 and R4 create offset voltages which are proportional to the differential input voltage. These voltages are used as inputs to a failsafe circuit. The second stage may include another amplification stage and a differential to single-ended converter, or may go directly to single ended conversion. After rail to rail levels are achieved, the second stage output goes directly into logic level gates as shown. A Timer Reset signal 11 is created from the logic level output of the receiver. The basic concept of the existing type failsafe circuit is to use window comparators to detect low differential voltage conditions on A1/B2 and B1/A2, and to use the Timer Reset signal to indicate bus activity.

Figure 2:
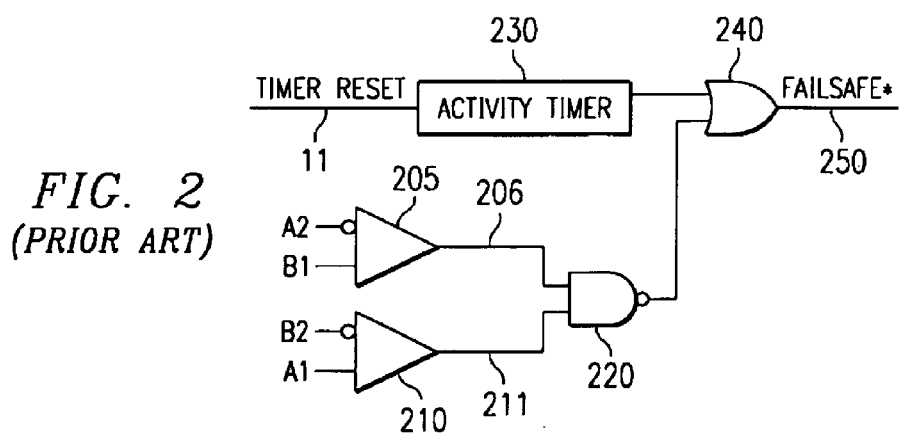
FIG. 2 illustrates a simple circuit diagram of a failsafe type circuit used with the input stage circuit of FIG. 1.

Referring now to FIG. 2 there is illustrated a simple circuit diagram of an existing failsafe type circuit that can be used with the input stage architecture shown in FIG. 1.

In this circuit, window comparators 205, 210 are used to detect the differential voltage created by resistors R3 and R4 of FIG. 1. When valid data exists at the inputs A2/B1, B2/A1, the outputs of one of the window comparators 205, 210 is high, and the other is low. When the differential input is below a predetermined level or threshold set by resistors R3 and R4 (from FIG. 1), the outputs of both comparators are high. The output of the NAND gate 220, therefore, is high when there is valid data on the bus, and low when the data signal is below the failsafe threshold. The activity timer 230 keeps the failsafe bit 250 from triggering at every signal transition that takes the signal through the zone of an established threshold. The activity timer 230 monitors activity on the bus by taking the timer reset signal, from the circuit of FIG. 1, as an input, and resets after a valid signal transition. In this way, the time required for invalid data to exist on the bus before a failsafe signal is issued can be set to a predetermined value. While there is bus activity of sufficient amplitude to drive the differential to single ended converter rail-to-rail, the output of the activity timer 230 is high. After activity has stopped, the activity timer 230 issues a low after a preset timeout period. After the activity timer 230 has gone low, the failsafe signal may go low (failsafe is active low) if a failsafe condition exists (NAND gate 220 output low) on the bus pins.

Figure 3:
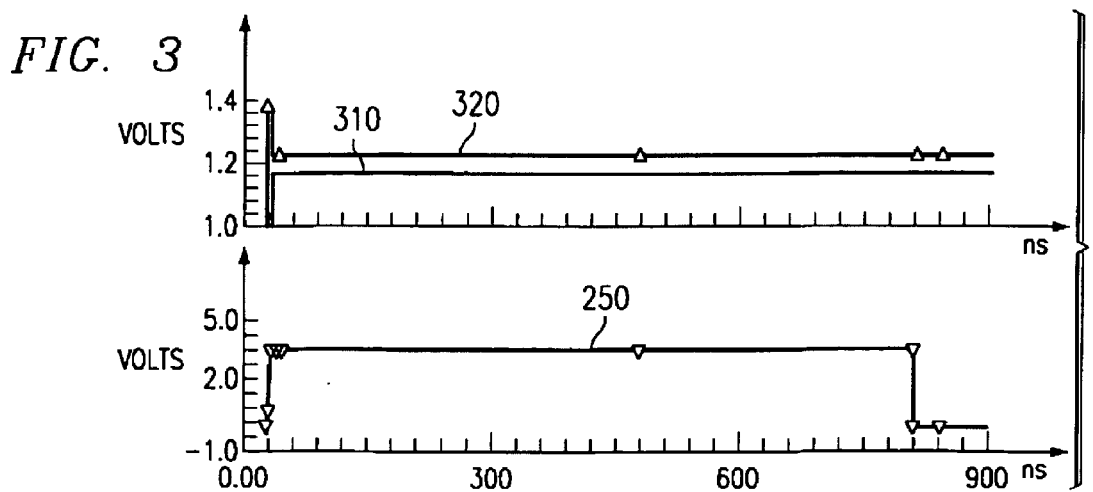
FIG. 3 shows a graphical representation of an operation result of the failsafe type circuit shown in FIG. 2.

Referring now to FIG. 3 there is illustrated a timing diagram which shows graphically the normal operation of the failsafe circuit illustrated in FIG. 2. In this simulation, the two inputs 310, 320 are given a positive value indicating that valid data exists on a bus, then immediately brought to an invalid state below some predetermined positive failsafe threshold. After the valid data signal goes high, the failsafe signal 250 resets, then 800 nS later (the failsafe timer setting in this simulation) failsafe is re-issued (Failsafe is active low).

One problem with the aforementioned failsafe circuit is that a failsafe can be issued due to noise during certain conditions, which can give false alarms, and set the receiver output in an incorrect state. One of the uses of the failsafe detection circuit is to set the state of the receiver output to a known state when a failsafe event is detected. This is accomplished by gating the receiver output with the failsafe signal. The problem occurs when valid data existing on the bus does not experience a signal transition in a time greater than the failsafe interval set by the activity timer 230. In this case, the output of the activity timer 230 is low, and failsafe output 250 of the OR gate 240 depends only on the NAND gate 220 output. If noise causes the differential voltage to momentarily dip below the predetermined failsafe threshold, the failsafe output 250 will immediately be activated. This happens because the activity timer 230 is only reset by the output of the receiver (timer reset signal from FIG. 1), and not by the output of the window comparators 205, 210. Since, only a valid data transition resets the timer, false failsafe is introduced when, for example, the data signal experiences long periods of low in the presence of noise.

Figure 4:
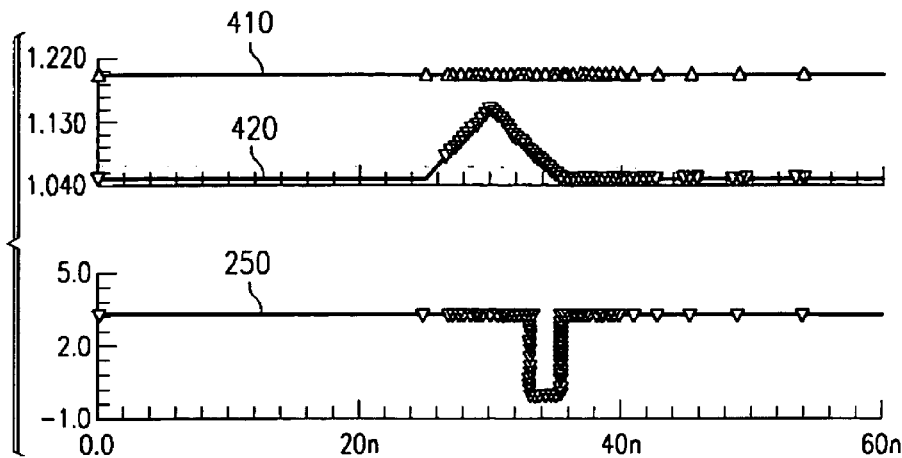
FIG. 4 shows a graphical representation of an invalid failsafe event which can occur when using the failsafe type circuit of FIG. 2.

Referring now to FIG. 4 there is illustrated an invalid failsafe event which occurs when using the failsafe circuit arrangement of FIG. 2. In this illustration, inputs 410, 420 have been in a valid state above the receiver threshold for a period of time longer than the activity timeout period. A 10 nS noise spike on signal 420 causes a failsafe threshold detection followed by a failsafe (250) glitch low because the timeout period has expired. If the circuit in this example were connected such that the receiver output was gated high, for example, by the failsafe bit, the receiver output would have changed states without any valid data change on the input. Further, the receiver output can oscillate as noise dissipates and re-emerges.

Figure 5:
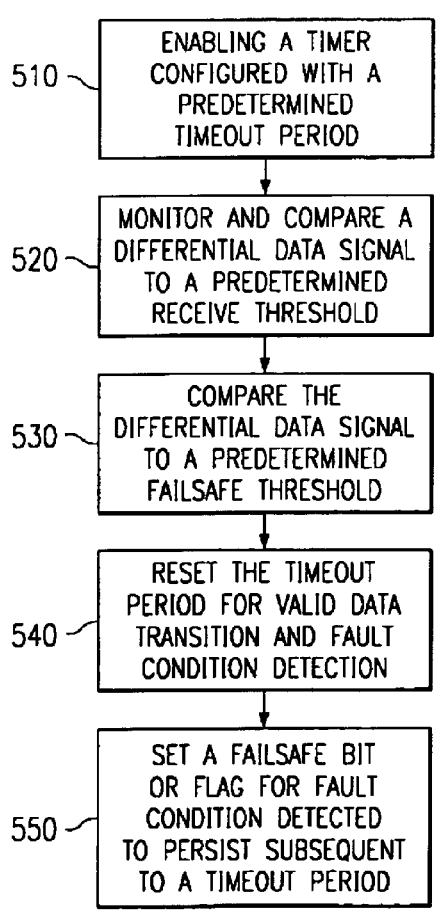
FIG. 5 illustrates a method flow chart for failsafe detection in accordance with an embodiment of the present invention.

Referring now to FIG. 5 there is shown a method flow chart for exemplary failsafe detection for a differential receiver in accordance with the present invention. The method uses a timer which is configured for a predetermined timeout period 510. The timer is further configured to receive at least two reset input signals. The timeout period can be determined, by a designer, for a specific application. A differential data signal is monitored and compared to a predetermined receive threshold 520 for detecting a valid data transition of the differential data signal, and is compared to a failsafe threshold 530 for detecting a fault condition associated with the signal bus. Again, the predetermined receive and failsafe thresholds can be determined, by a designer, for a specific application. For each detected valid data transition and fault condition, a signal is enabled as an input to the timer, thus, resetting the timeout period 540. A failsafe bit or flag is set for a failsafe condition determined to persist subsequent to a timeout period. The failsafe bit or flag can then be used by the differential receiver to deal with the fault condition in a manner appropriate for the specific application. The aforementioned method can be enabled in software, hardware or a combination of both.

Figure 6:
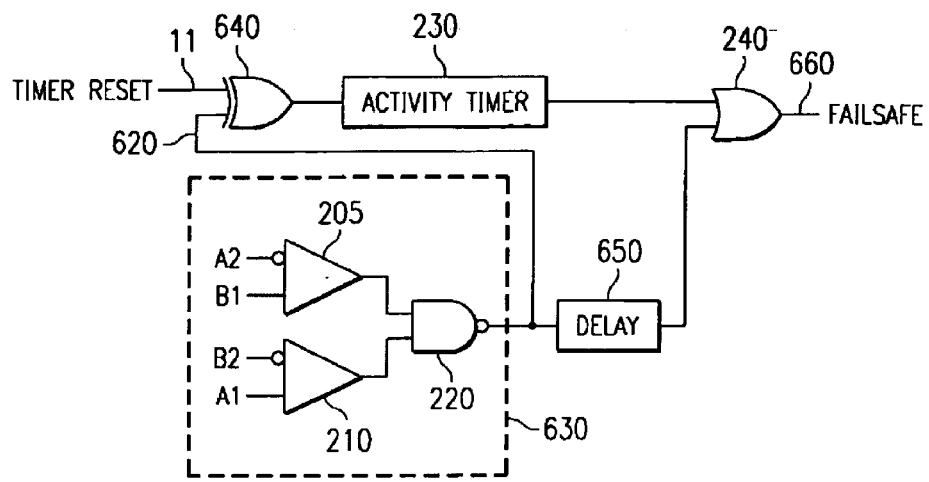
FIG. 6 illustrates a failsafe circuit in accordance with an embodiment of the present invention.

Referring now to FIG. 6 there is illustrated a failsafe circuit in accordance with an exemplary embodiment of the present invention. In this circuit, the activity timer 230 is reset for valid data transitions and data transitions which cross a predetermined failsafe threshold. Thus, the input to the activity timer 230 is toggled, by the XOR gate 640, whenever the Timer Reset switches (valid data transition) and whenever the window comparator 630 detects a failsafe threshold transition 620.

In the FIG. 6 embodiment, comparators 205, 210 are used to detect differential voltage created by offset voltage resistors of a differential receiver device, such as R3 and R4 of FIG. 1. The output of NAND gate 220 is high when there is valid data on the bus and low when the data signal is below a predetermined failsafe threshold. However, the output of the NAND gate 220 is delayed to OR gate 240 by a predetermined period. The delay device 650 is built into the OR gate input to keep a glitch or premature toggle from occurring when failsafe is detected. If the delay device 650 were not present, the failsafe condition would be transmitted through the OR gate 240 to the Failsafe bit at 660 before the activity timer 230 is reset, causing the glitch. The delay introduced by the delay device 650 must be longer than the inherent delay through the XOR gate 640 and the activity timer 230, such that the failsafe condition signaled by NAND gate 220 does not reach OR gate 240 before the activity timer output is driven high in response to the failsafe condition. The delay device 650 can be a simple RC circuit designed for a predetermined signal delay period.

Figure 7:
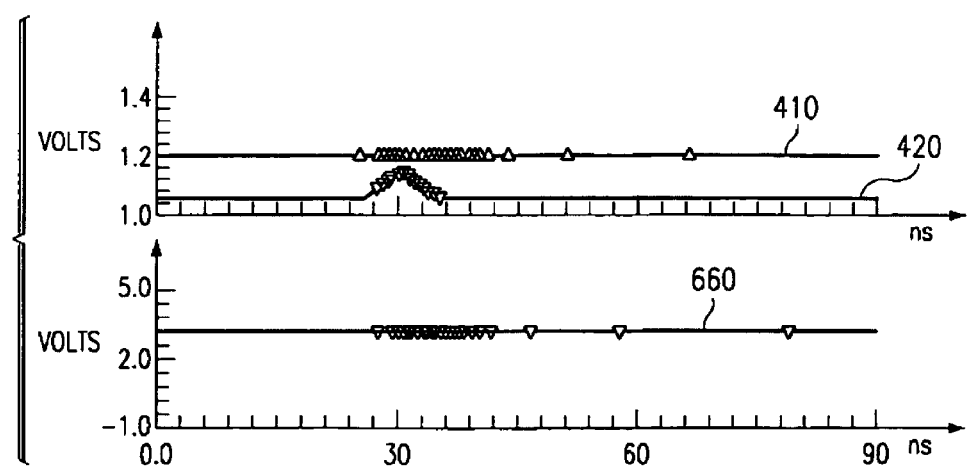
FIG. 7 shows a graphical representation of the output of the failsafe circuit shown in FIG. 6.

Referring now to FIG. 7 there is illustrated an output of a failsafe circuit in accordance with the present invention. The stimulus for the output shown in FIG. 7 is the same stimulus as the illustration of FIG. 4. The inputs 410, 420 have been in a valid state above the receiver threshold for a period of time longer than the activity timer 230 timeout period. The 10 nS noise spike on signal 420 does not cause the failsafe 660 to glitch low as did failsafe 250 in FIG. 4. When the circuit of FIG. 6 is connected such that the receiver output is gated high by the failsafe bit, the receiver output does not change states on the occurrence of the noise spike unless the failsafe condition persist beyond the timeout period (which is reset on the occurrence of the depicted 10 nS noise spike).

Figure 8:
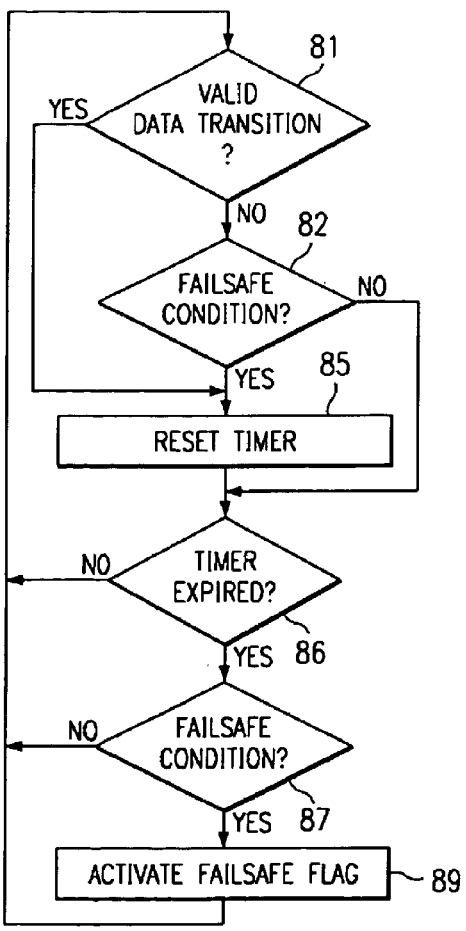
FIG. 8 illustrates exemplary operations which can be performed by the embodiment of FIG. 6.

Referring now to FIG. 8 there is illustrated exemplary operations which can be performed by the embodiment of FIG. 6. The operations include determining if a valid data transition has occurred 81. If a valid data transition has occurred, operation passes to commence a countdown time period 85, otherwise, operation passes to determining if a failsafe condition has occurred 82. From the failsafe condition determination operation 82, when a failsafe condition occurrence is determinative, operation again passes to commence a countdown time period 85, otherwise, operation passes to determine if the countdown period has expired 86. From the countdown period expiration determination operation 86, when an expiration is determinative, operation passes to determine if a failsafe condition is active 87, otherwise operation passes back to the valid data transition determination operation 81. From the failsafe condition active operation 87, a determinative active failsafe condition passes operation control to activate a failsafe flag 89, otherwise operation passes back to the valid data transition determination operation 81.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An apparatus for providing failsafe detection for a differential receiver that produces a bus activity indicator signal when receiving a differential data signal of sufficient amplitude ton transition through a first predetermined receiver threshold, said apparatus comprising:
   a window comparator having an input coupled to said differential receiver and operable to activate a failsafe signal when a transition below a second predetermined threshold occurs on said differential receiver, said second predetermined threshold being less than said first predetermined threshold;
   a timer coupled to said window comparator and having an input to receive said bus activity indicator signal and said failsafe signal, said timer operable for deactivating a timeout signal in response to each activation of said bus activity indicator signal and said failsafe signal, said timer further for activating said timeout signal if a predetermined period of time elapses since a most recent deactivation of said timeout signal; and
   a failsafe indicator gate coupled to said timer and said window comparator to receive said timeout signal and said failsafe signal, and having an output to set a flag when said failsafe signal and said timeout signal are both active.

2. The apparatus of claim 1, wherein said failsafe indicator gate comprises an OR gate.

3. The apparatus of claim 1, wherein said window comparator further comprises:
   first and second comparators configured to compare said differential data signal with respective first and second references, wherein said first and second references are at said second threshold and represent a failsafe threshold; and
   a logic gate coupled to said comparators to receive outputs from said comparators.

4. The apparatus of claim 3, wherein said timer includes an exclusive OR gate which receives said bus activity indicator signal and failsafe signal as inputs, and wherein an output of said exclusive OR deactivates said timeout signal.

5. The apparatus of claim 1, further comprising a delay device coupled between said window comparator and said failsafe indicator gate to delay arrival of said failsafe signal at said failsafe indicator gate for a delay time period.

6. The apparatus of claim 5, wherein said delay time period exceeds an amount of time required for said timer to deactivate said timeout signal.

7. The apparatus of claim 6, wherein said delay device comprises an RC circuit.

8. A system for providing failsafe detection in a differential receiver network, said system comprising:
   a differential input device configured to provide a timer reset signal upon receiving a differential data signal of sufficient amplitude to transition through a predetermined receive threshold;
   a fault detection device coupled to said differential input device and configured to provide an indicator signal when said differential data signal transitions into a fault threshold region, said fault threshold being less than said receive threshold;
   a resettable timer coupled to said differential input device and said fault detection device and configured to provide a timeout signal upon expiration of a predetermined amount of time after receiving either said timer reset signal or said indicator signal; and
   a failsafe indicator device coupled to said timer and said fault detection device and configured to set a flag when said indicator signal persists following expiration of said amount of time.

9. The system of claim 8, wherein said failsafe indicator device comprises an OR gate which receives said timeout signal and said indicator signal as inputs.

10. The system of claim 8, wherein said fault detection device further comprises:
    first and second comparators configured to compare said differential data signal with respective first and second references, wherein said first and second references are at said fault threshold and represent a failsafe threshold; and
    a logic gate coupled to said comparators to receive outputs from said comparator.

11. The system of claim 10, wherein said timer includes an exclusive OR gate that receives said timer reset signal and said indicator signal as inputs, and wherein an output of said exclusive OR gate initiates activation of said timeout signal.

12. The system of claim 8, further comprising a delay device coupled between said fault detection device and said failsafe indicator device to delay arrival of said indicator signal at said failsafe indicator device for a delay time period.

13. The system of claim 12, wherein said timer is operable for initially deactivating said timeout signal upon receiving either said timer reset signal or said indicator signal, and wherein said delay time period exceeds an amount of time required for said timer to deactivate said timeout signal.

14. The system of claim 13, wherein said delay device comprises an RC circuit.

15. A method of providing failsafe detection in a differential receiver circuit, said method comprising;
    comparing a differential data signal received by said differential receiver circuit to a predetermined receive threshold, said failsafe threshold being less than said receive threshold, and commencing a countdown time period upon detecting a receive threshold transition;
    comparing said differential data signal to a predetermined failsafe threshold and commencing a countdown time period upon detecting a failsafe threshold transition; and
    setting an indicator flag upon detecting a failsafe threshold transition following expiration of one of the countdown time periods.

16. The method of claim 15, wherein said setting step includes using an OR gate to set said indicator flag, and including said OR gate receiving indications of both of said threshold transitions.

17. The method of claim 15, wherein said setting step includes using a first logic gate to set said indicator flag, and including said first logic gate receiving indications of both of said threshold transitions, and wherein said commencing steps include using a second logic gate to commence the countdown time periods, and including said second logic gate receiving indications of both of said threshold transitions.

18. The method of claim 15, wherein said commencing steps include using an exclusive OR gate to commence the countdown time periods, and including said exclusive OR gate receiving indications of both of said threshold transitions.

19. The method of claim 15, including providing a failsafe condition indication in response to said first-mentioned detecting step, said second-mentioned detecting step including delaying said failsafe condition indication for a delay period of time.

20. The method of claim 19, wherein said delay period exceeds an amount of time required for commencement of one of the countdown time periods after detection of the corresponding threshold transition.

* * * * *